US006169456B1

United States Patent
Pauls (10) Patent No.: US 6,169,456 B1
(45) Date of Patent: Jan. 2, 2001

(54) AUTO-BIASING CIRCUIT FOR CURRENT MIRRORS

(75) Inventor: Gregory W. Pauls, Westminster, CO (US)

(73) Assignee: STMicroelectronics N.V., Amsterdam (NL)

( * ) Notice: Under 35 U.S.C. 154(b), the term of this patent shall be extended for 0 days.

(21) Appl. No.: 09/227,283

(22) Filed: Jan. 6, 1999

(51) Int. Cl.[7] ..................................................... H03F 3/04
(52) U.S. Cl. ........................ 330/288; 323/315; 323/316; 330/296
(58) Field of Search .................................. 330/288, 296, 330/311, 310; 323/315, 316

(56) References Cited

U.S. PATENT DOCUMENTS

| | | | |
|---|---|---|---|
| 4,697,153 | * | 9/1987 | Lish ...................................... 330/288 |
| 4,897,596 | * | 1/1990 | Hughes et al. ........................ 323/315 |
| 5,359,296 | * | 10/1994 | Brooks et al. ........................ 330/288 |

OTHER PUBLICATIONS

P. Gray et al., *Analysis and Design of Analog Integrated Circuits*, pp. 269–287, 1993.

T. Serrano et al., "The Active–Input Regulated–Cascode Current Mirror", *IEEE Trans. On Circuits and Systems, I: Fundamental Theory and Applications*, vol. 41, No. 6, pp. 464–467 Jun. 1994.

F. You et al., "An Improved Tail Current Source For Low Voltage Applications", *IEEE Journal of Solid–State Circuits*, vol. 32, No. 8, pp. 1173–1179, Aug. 1997.

A. Abidi, "On the Operation of Cascode Gain Stages", *IEEE Journal of Solid–State Circuits*, vol. 23, No. 6, pp. 1434–1437, Dec. 1988.

E. Säckinger et al., "A High–Swing, High Impedance MOS Cascode Circuit", *IEEE Journal of Solid–State Circuits*, vol. 25, No. 1, pp. 289–298, Feb. 1990.

A. Grebene, *Bipolar and MOS Analog Integrated Circuit Design*, pp. 169–193, 1984.

M. Ismail et al., *Analog VLSI Signal and Information Processing*, pp.. 206–209, 1994.

D. Johns et al., *Analog Integrated Circuit Design*, pp. 125–142, 1997.

P. Allen et al., *CMOS Analog Circuit Design*, pp. 219–239, 1987.

* cited by examiner

*Primary Examiner*—Michael B Shingleton
(74) *Attorney, Agent, or Firm*—Theodore E. Galant; Lisa K. Jorgenson; James H. Morris (57) ABSTRACT

In accordance with the present invention, an auto-biased cascode current circuit capable of improved range in headroom is disclosed. In one embodiment, the current circuit includes a current mirror and a bias circuit, where the current mirror contains a reference leg and an output leg. A reference current flows within the reference leg. Included in the output leg is an output terminal, a first output transistor and a second output transistor. The output terminal operates at an output potential. The bias circuit regulates the reference leg of the current mirror such that the output potential is substantially equal to a drain-to-source saturation voltage of the first output transistor plus a drain-to-source saturation voltage of the second output transistor plus a predetermined overdrive voltage. The predetermined overdrive voltage is a design parameter which is less than a threshold voltage. Even as the reference current changes, the bias circuit regulates the reference leg so that the reference current may change significantly while the bias circuit still maintains a proper output potential. In another embodiment, a method for auto-biasing a cascode current circuit is disclosed. The method detects at least one voltage potential from the reference leg and uses this information generate a cascode potential to bias the reference leg.

18 Claims, 6 Drawing Sheets

AUTO-BIASING CIRCUIT FOR CURRENT MIRRORS

FIELD OF THE INVENTION

The present invention relates to current mirror circuits, and in particular, to bias circuits for current mirror circuits.

BACKGROUND OF THE INVENTION

Current circuits of various configurations are a common building block of electronic circuits. Typically, current circuits are used to form a current mirror. Current mirrors either sink or source current in such a way as to respectively receive or provide a substantially constant current to a load.

Figure 1:
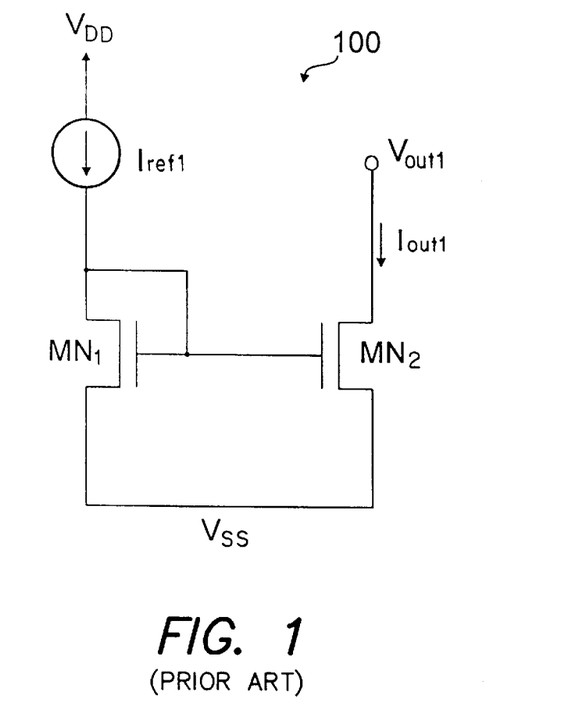
FIG. 1 is a schematic of a conventional current mirror configured to sink current.

With reference to FIG. 1, a conventional two-transistor current mirror 100 is shown in schematic form. A reference current $I_{ref1}$ is provided to a diode-connected reference transistor $MN_1$ which is mirrored by an output transistor $MN_2$ to produce an output current $I_{out1}$. Characteristic of current mirrors, the output current $I_{out1}$ is substantially equal to the reference current $I_{ref1}$ long as the geometry of the reference transistor $MN_1$ is substantially the same as the geometry of the output transistor $MN_2$. Those skilled in the art can appreciate however, that the ratio of the output current $I_{out1}$ to the reference current $I_{ref1}$ may be modified by changing the ratio of the geometry of the output transistor $MN_2$ to the reference transistor $MN_1$.

Figure 2:
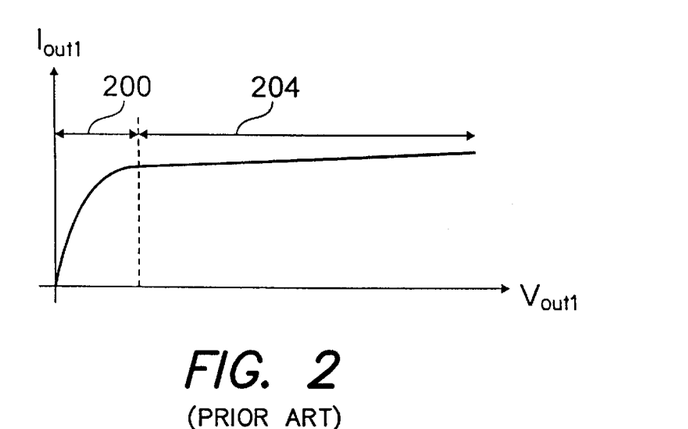
FIG. 2 is a graph depicting the output current as the output voltage changes for the conventional current mirror of FIG. 1.

The simple current mirror 100 allows for low-swing operation of an output voltage $V_{out1}$ of a load, but suffers from poor output resistance. FIG. 2 is a graph which shows the relationship between the output current $I_{out1}$ along the ordinate direction and the output voltage $V_{out1}$ along the abscissa. The response graph of the current mirror 100 is divided between a triode region 200 and a saturation region 204. The saturation region 204 is defined as the output voltage $V_{out1}$ being larger then a saturation voltage $V_{DS(sat)2}$ of the output transistor $MN_2$. In general, the saturation voltage $V_{DS(sat)}$ is defined as the drain-to-source voltage of a transistor necessary to begin operation of that transistor in the saturation region which is shown as the "knee" of the curve in FIG. 2. While operating in the saturation region 204, changes in output voltage $V_{out1}$ at the load have little effect on the output current $I_{out1}$. However, while operating in the triode region 200, changes in output voltage $V_{out1}$ at the load have great effect on the output current $I_{out1}$. In other words, the output voltage $V_{out1}$ can swing as low as the saturation voltage $V_{DS(sat)2}$ before the output resistance becomes unacceptably affected. Although the simple current mirror 100 provides for a low-swinging output voltage, those skilled in the art can appreciate, that the output resistance is still undesirably low while operating in the saturation region 204.

Figure 3:
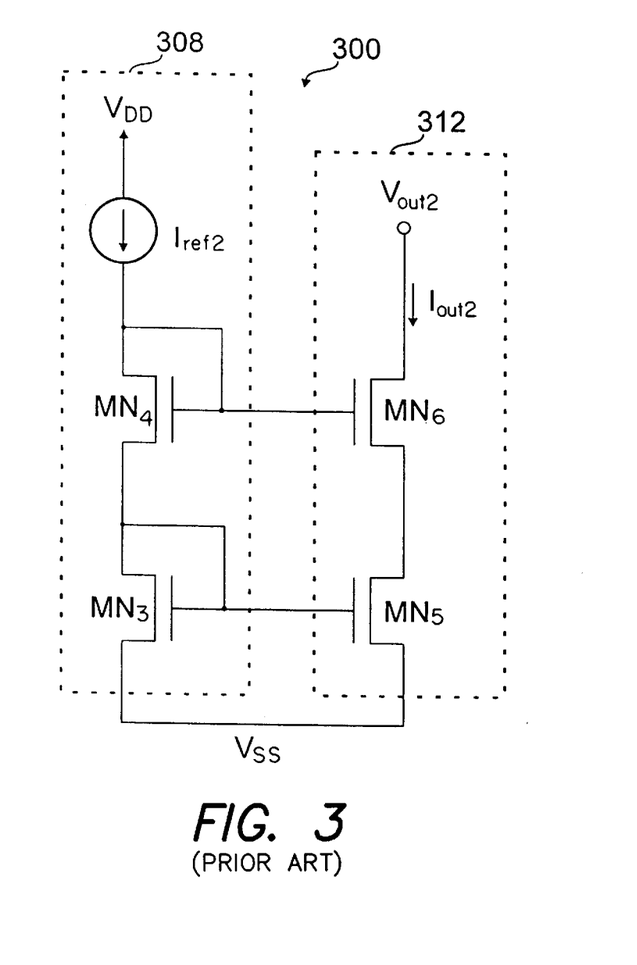
FIG. 3 is a schematic of a conventional cascode current mirror configured to sink current.

With reference to FIG. 3, a conventional cascode current mirror 300 is drawn in schematic form. A first reference transistor $MN_3$ and second reference transistor $MN_4$, which are diode connected, form the reference leg 308 of the cascode current mirror while a first output transistor $MN_5$ and second output transistor $MN_6$ form the output leg 312. The second output transistor $MN_6$ is known as a cascode transistor and serves to buffer output voltage $V_{out2}$ swings from the first output transistor $MN_5$ such that the first output transistor $MN_5$ is more likely to remain operating in saturation.

Figure 4:
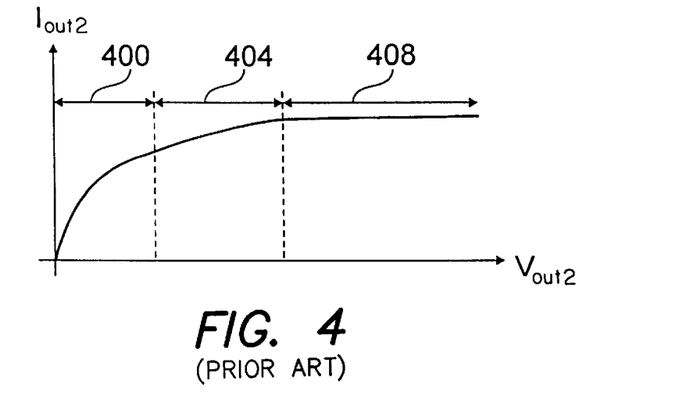
FIG. 4 is a graph depicting the output current as the ouput voltage changes for the conventional cascode current mirror of FIG. 3.

Conventional cascode current mirrors 300 provide excellent output resistance at the expense of a lower swing on the output voltage $V_{out2}$ (i.e., the ability of the output voltage $V_{out2}$ to swing low while maintaining a high output resistance). With reference to FIG. 4, a graph of the relationship between output current $I_{out2}$ along the ordinate direction and output voltage $V_{out2}$ along the abscissa is shown. When both the first and second output transistors $MN_5$, $MN_6$ are in the saturation region 408, the output current $I_{out2}$ remains nearly constant as the output voltage $V_{out2}$ changes. In other words, the output resistance is extremely high while the output transistors $MN_5$, $MN_6$ are saturated. However, as the second output transistor $MN_6$ passes into the triode region 404 the output resistance decreases. The output resistance decreases further when both the first and second output transistors $MN_5$, $MN_6$ pass into the triode region 400. For both output transistors $MN_5$, $MN_6$ to remain in saturation 408, Equation 1 must be satisfied:

$$V_{out(min)2} > V_t + V_{DS(sat)5} + V_{DS(sat)6} \qquad (1)$$

Equation 1 merely states the minimum output voltage $V_{out(min)2}$ cannot fall below the sum of a threshold voltage $V_t$, the saturation voltage $V_{DS(sat)5}$ of the first output transistor $MN_5$ and the saturation voltage $V_{DS(sat)6}$ of the second output transistor $MN_6$. Where the voltage threshold term $V_t$ is a process variable which is generally the same for all NMOS transistors for a particular semiconductor process and can be defined by the following Equation 2:

$$V_t = V_{GS} - V_{DS(sat)} \qquad (2)$$

Where $V_{GS}$ is the gate-to-source voltage of a transistor. Stated another way, the threshold voltage $V_t$ defines the gate-to-source voltage $V_{GS}$ at which a conduction channel forms between the drain and source. If however, the output voltage falls below the point defined by Equation 1, at least one of the output transistors $MN_5$, $MN_6$ will begin operating in the triode region which significantly decreases the output resistance. It should be noted, that although the output resistance of the cascode current mirror 300 is greater than that of the simple current mirror 100, the low-swing of the cascode current mirror 300 is considerably higher than the low-swing of the simple current mirror 100.

Output resistance of a current mirror is important because it defines how the output current will change as the output voltage changes. Operating the transistors of the output leg $MN_2$, $MN_5$, $MN_6$ of a current mirror 100, 300 in the saturation region significantly increases the output resistance. Additionally, the use of the cascode current mirror 300 increases the output resistance when compared to the simple current mirror 100.

Headroom is important because it defines the range in which the output voltage $V_{out2}$ may operate. The lowest swing of the output voltage $V_{out(min)2}$ defines the lower limit of the headroom, while the positive power supply $V_{DD}$ generally defines the upper limit of the headroom (i.e., $V_{out(max)2} = V_{DD}$). Any load circuit which uses the current mirror generally operates within the range defined by the headroom to assure adequate output resistance. Recently, there has been a trend toward lower voltage power supplies $V_{DD}$, because of their reduced power consumption. However, reducing the power supply $V_{DD}$ impinges upon the upper range of the headroom $V_{out(max)2}$ available to the load circuit utilizing the current mirror. Accordingly, there is a need to increase headroom for current mirrors without reducing output resistance.

SUMMARY OF THE INVENTION

In accordance with the present invention, an auto-biased cascode current circuit capable of improved range in headroom is disclosed. In one embodiment, the current circuit includes a current mirror and a bias circuit, where the current mirror contains a reference leg and an output leg. A reference current flows within the reference leg. Included in the output leg is an output terminal, a first output transistor and a second output transistor. The output terminal operates at an output potential. The bias circuit regulates the reference leg of the current mirror such that the output potential is substantially equal to a drain-to-source saturation voltage of the first output transistor plus a drain-to-source saturation voltage of the second output transistor plus a predetermined overdrive voltage. The predetermined overdrive voltage is a design parameter which is less than a threshold voltage. Even as the reference current changes, the bias circuit regulates the reference leg so that the reference current may change significantly while the bias circuit still maintains a proper output potential.

In another embodiment, a method for auto-biasing a cascode current circuit is disclosed. The method detects at least one voltage potential from the reference leg and uses this information to generate a cascode potential to bias the reference leg. In this way, low-swing operation of the cascode current circuit is maintained even if the reference current changes.

Based upon the foregoing summary, a number of important advantages of the present invention are readily discerned. A high output resistance is achieved because of the cascode configuration of the current mirror while still allowing the output voltage to swing low. The ability to swing low provides additional range in headroom for the load. Additionally, the current mirror is auto-biased such that a large range of reference currents are supported without needing to redesign the bias circuitry.

Additional advantages of the present invention will become readily apparent from the following discussion, particularly when taken together with the accompanying drawings.

DETAILED DESCRIPTION

Figure 5:
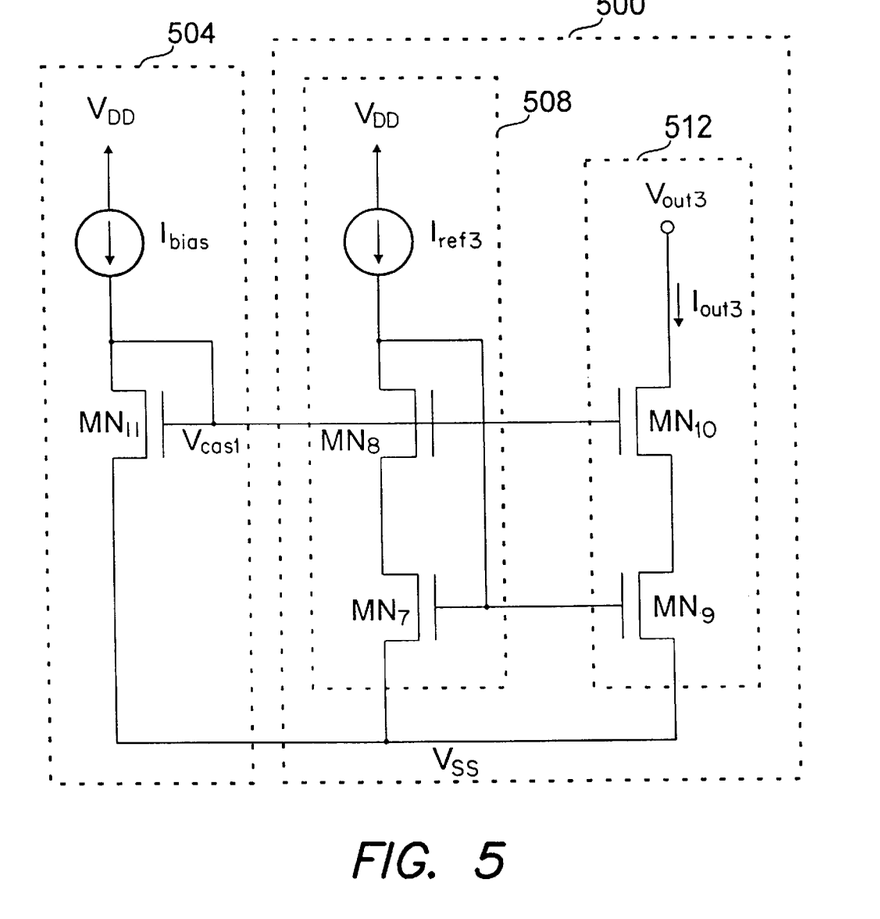
FIG. 5 is a schematic of a manually-biased cascode current mirror which is capable of supporting a low swinging output voltage.

With reference to FIG. 5, a cascode current mirror 500 with a high output resistance and a low swing output voltage is shown in schematic form. The first and second reference transistors MN7, MN8, which form a reference leg 508, are configured such that the output voltage $V_{out(min)3}$ can swing lower than a conventional cascode current mirror 300 (see FIG. 3). More specifically, so long as the minimum output voltage $V_{out(min)3}$ is such that Equation 3 is satisfied, a first and second output transistors $MN_9$, $MN_{10}$ of a output leg 512 will remain in saturation $V_{DS(sat)9}$, $V_{DS(sat)10}$.

$$V_{out(min)3} > V_{DS(sat)9} + V_{DS(sat)10} \tag{3}$$

By operating the first and second output transistors $MN_9$, $MN_{10}$ in the saturation region, the output resistance advantageously remains large. Comparison of Equation 3 with Equation 1, which define the minimum output voltage $V_{out(min)}$ for their respective circuits, reveals the low swing current mirror 500 can tolerate a lower output voltage $V_{out(min)}$ than the convention current mirror 300 by an additional voltage threshold $V_t$ while maintaining the same large output resistance. By lowering the swing of the output voltage $V_{out(min)3}$ for the low-swing current mirror 500, the range of headroom available to the load is increased accordingly.

Figure 6:
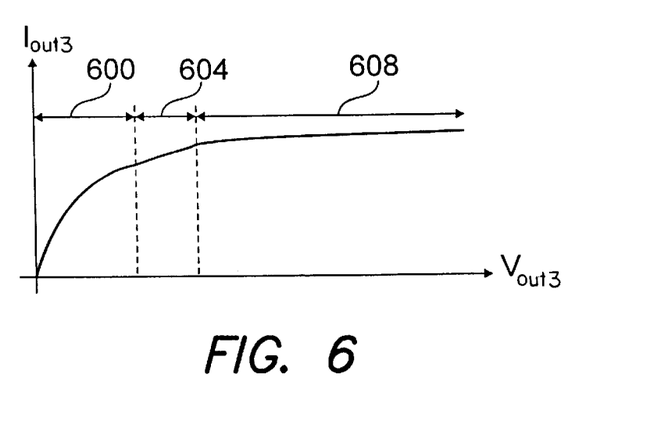
FIG. 6 is a graph depicting the output current as the output voltage changes for the low-swing cascode current mirror of FIG. 5.

FIG. 6 shows a graph of an output current $I_{out3}$ in the ordinate direction and the output voltage $V_{out3}$ along the abscissa for the low-swing cascode current source 500. As can be seen from the graph, the output current $I_{out3}$ remains substantially constant as the output voltage $V_{out3}$ varies, so long as a first output transistor $MN_9$ and a second output transistor $MN_{10}$ both operate in saturation mode 608. That as to say, operating the transistors $MN_9$, $MN_{10}$ in the output leg 512 of the current mirror advantageously provides a large output resistance while both transistors operate in saturation mode 608. The output resistance decreases when either one 604 or both 600 of the output transistors $MN_9$, $MN_{10}$ operate in the triode region.

Although providing lower swing on the output voltage $V_{out(min)3}$ and a large output resistance, the cascode current mirror 500 shown in FIG. 5 requires a manual bias circuit 504 to provide a cascode voltage $V_{cas1}$ to the gate terminal of each of the cascode transistors $MN_8$, $MN_{10}$. The optimal minimum value for the cascode voltage $V_{cas1(min)}$ (i.e., producing the most headroom for the output voltage $V_{out3}$) is the saturation voltage $V_{DS(sat)7}$ for the first reference transistor $MN_7$ plus the saturation voltage $V_{DS(sat)8}$ for the second reference transistor $MN_8$ plus the threshold voltage $V_t$ for the second reference transistor $MN_8$, as defined by the following Equation 4:

$$V_{cas1(min)} = V_{DS(sat)7} + V_{DS(sat)8} + V_t \tag{4}$$

To produce the cascode voltage $V_{cas1}$, a bias current $I_{bias}$ is provided to a diode connected transistor $MN_{11}$ so that the cascode voltage $V_{cas1}$ properly biases the cascode transistors $MN_8$, $MN_{10}$. The bias current $I_{bias}$ flowing through the diode connected transistor $MN_{11}$ forces a proportional gate potential $V_{G11}$ which is used as the cascode voltage $V_{cas1}$. Biasing in this way, allows achieving the low swing of the output voltage $V_{out(min)3}$ defined by Equation 3 which maximizes the headroom available to the load.

To provide a proper bias current $I_{bias}$ a designer must provide a current source circuit. Generally, these circuits are static. This means they provide a single bias current $I_{bias}$ which cannot respond to changing needs of the cascode voltage $V_{cas1}$. As those skilled in the art can appreciate however, if the reference current $I_{ref3}$ changes, the saturation voltage $V_{DS(sat)7}$ must also change to maintain maximum headroom for the output voltage $V_{out3}$. As shown in Equation 4 above, the cascode voltage $V_{cas1}$ should be adjusted when the saturation voltage $V_{DS(sat)7}$ changes which also means the current source circuit providing the bias current $I_{bias}$ should change accordingly. It should be noted however, that some applications require accommodation of especially large current swings on the output leg 512 of tune current mirror (i.e., large swings in output current $I_{out3}$) such as switching loads. Large variances in output current $I_{out3}$ require large swings in reference current $I_{ref3}$ which require large swings in bias current $I_{bias}$.

As those skilled in the art can appreciate, choosing the proper cascode voltage $V_{cas1}$ can be an arduous task since the saturation voltage $V_{DS(sat)7}$ is not only affected by changes in the reference current $I_{ref3}$ (as discussed above), but also semiconductor process variables, operating temperature, and other factors. Designers typically raise the bias current $I_{bias}$ to compensate for changes in the reference current $I_{ref3}$, semiconductor process variables, operating temperature, and other factors which may affect the saturation voltage $V_{DS(sat)7}$ and also raise the cascode voltage $V_{cas1}$. By raising the cascode voltage $V_{cas1}$ however, the minimum swing available to the output voltage $V_{out(min)3}$ also undesirably raises which affects the range of headroom available to the load. This reduction in the headroom is becoming less acceptable as the power supply voltage $V_{DD}$ is lowered to conserve power. Accordingly, there is a need to provide a low-swing cascode current source which automatically compensates for such factors as the reference current $I_{ref3}$, semiconductor process variables and operating temperature.

Figure 7:
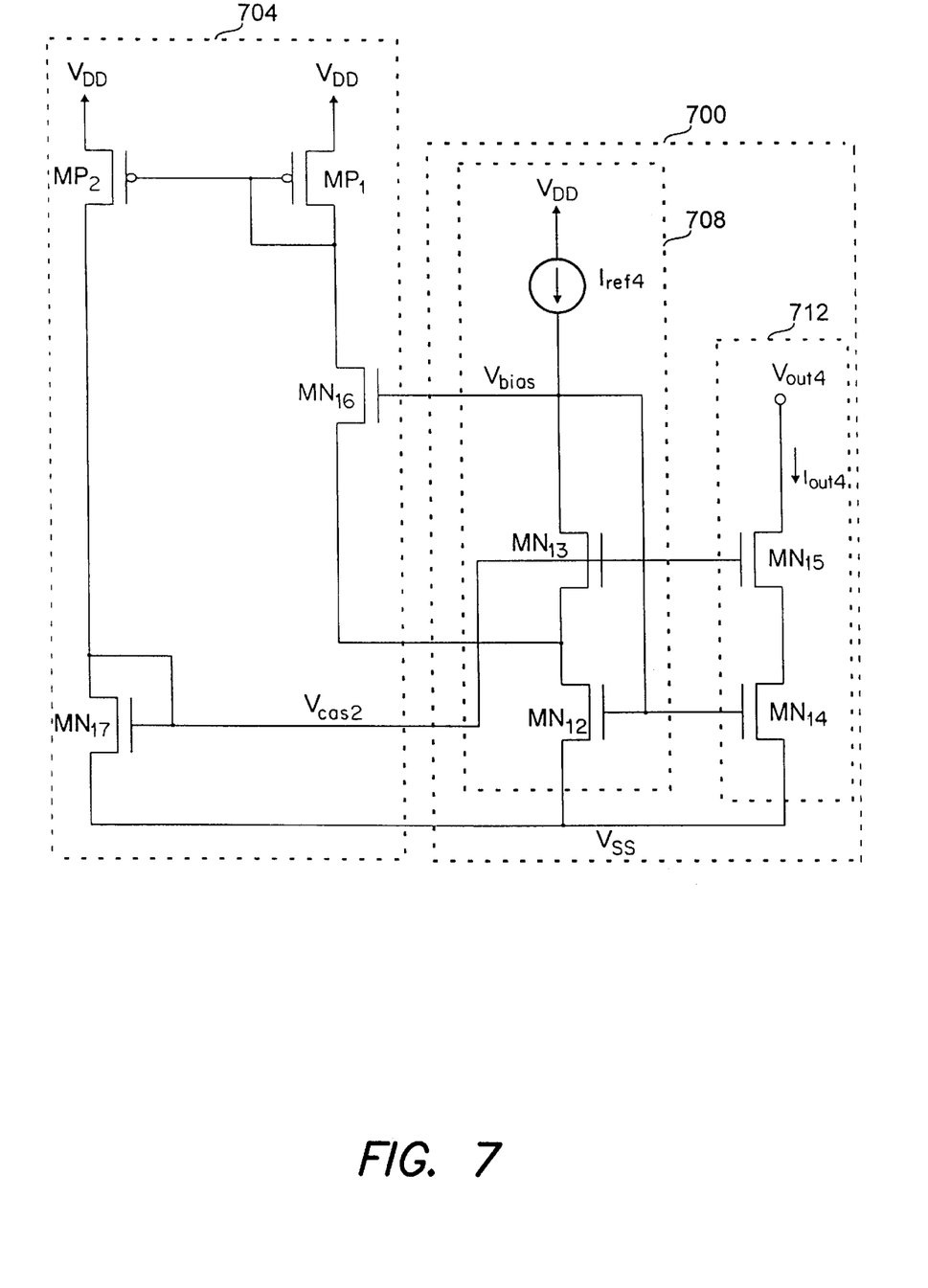
FIG. 7 is a schematic of a cascode current mirror which features a low swing and auto-biasing.

With reference to FIG. 7, an embodiment of an auto-biased low-swing current mirror is shown in schematic form. This embodiment generally includes a cascode current mirror 700 having a reference leg 708 and an output leg 712, but also includes an auto-biasing circuit 704 which compensates for the factors which require adjusting a cascode voltage Vcas2 to maintain the maximum range of headroom on the output voltage $V_{out4}$. In brief, a first through fourth bias transistors $MN_{16}$, $MP_1$, $MP_2$, $MN_{17}$ of the auto-biasing circuit 704 cooperate to provide feedback which dynamically compensates for such factors as reference current $I_{ref4}$, semiconductor process variables and operating temperature in order to properly bias a current mirror 700 portion of the circuit. Use of feedback in this way generally allows for providing the maximum range of headroom to the output voltage $V_{out4}$ of the load.

The goal of the bias circuit 704 is to maintain a minimum headroom voltage $V_{out(min)4}$, while factors which affect a saturation voltage $V_{DS(sat)14}$, $V_{DS(sat)15}$ of a first output transistor $MN_{14}$ and a second output transistor $MN_{15}$ change. The minimum output voltage $V_{out(min)4}$ which assures the first and second output transistors $MN_{14}$ $MN_{15}$ remain in saturation $V_{DS(sat)14}$, $V_{DS(sat)15}$ is described in Equation 5:

$$V_{out(min)4} > V_{DS(sat)14} + V_{DS(sat)15} \quad (5)$$

As described more fully above, keeping the first and second output transistors $MN_{14}$, $MN_{15}$ in saturation desirably creates a large output resistance for the load.

To maintain the condition defined in Equation 5 while the factors which affect the saturation voltages $V_{DS(sat)14}$, $V_{DS(sat)15}$ change, a cascode voltage $V_{cas2}$ and a bias voltage $V_{bias}$ must also change. If the following Equations 6, 7 and 8 are satisfied, the minimum output voltage defined by Equation 5 is generally maintained:

$$V_{bias} = V_t + V_{DS(sat)12} \quad (6)$$

$$V_{cas2(min)} = V_{DS(sat)12} + V_{DS(sat)13} + V_t \quad (7)$$

$$V_{D12} = V_{DS(sat)12} \quad (8)$$

Where $V_{DS(sat)12}$ is the saturation voltage of a first reference transistor $MN_{12}$ for particular reference current $I_{ref4}$, and $V_{D12}$ is the voltage on the drain of $MN_{12}$. The bias circuit 704 generally satisfies the conditions expressed in Equations 6, 7 and 8 while allowing the reference current $I_{ref4}$ to preferably change by orders of magnitude. As can be appreciated by those skilled in the art, the auto biasing circuit 704 avoids having to redesign the current source needed to supply a bias current $I_{bias}$ to the manual bias circuit 504 (see FIG. 5) to accommodate different reference currents $I_{ref3}$.

The auto bias circuit 704 is comprised of a first through fourth bias transistors $MN_{16}$, $MP_1$, $MP_2$, $MN_{17}$. The gate of a first bias transistor $MN_{16}$ is attached to the drain of the second reference transistor $MN_{13}$ and to the gate of the first reference transistor $MN_{12}$. The source of the first bias transistor $MN_{16}$ is attached to the source of the second reference transistor $MN_{13}$ and to the drain of the first reference transistor $MN_{12}$. A NMOS transistor threshold $V_t$ is produced across the gate and source of the first bias transistor $MN_{16}$ (i.e., $V_{GS} = V_t$). Consequently, the interconnections between the first bias transistor $MN_{16}$ and the first and second reference transistors, $MN_{13}$ assure a positive transistor threshold $+V_t$ will also exist across the drain and source of the second reference transistor (i.e., $V_{DS13} = V_t$), while a negative transistor threshold $-V_t$ wilt exist across the gate and drain of the first transistor (i.e., $V_{GD12} = -V_t$). The first bias transistor is matched to the first reference transistor $MN_{12}$ (i.e., has substantially the same layout and geometry).

The second and third bias transistors $MP_1$, $MP_2$, are PMOS transistors which form a simple current mirror to source current. The second bias transistor $MP_1$ is diode connected. Because of the nature of the current mirror, the current through the first bias transistor $MN_{16}$ is substantially equal too the current through a fourth bias transistor $MN_{17}$.

The fourth bias transistor $MN_{17}$ is diode connected. A cascode voltage $V_{cas2}$ is produced at the gate of the fourth bias transistor $MN_{17}$ which is proportional to the current flowing through the fourth bias transistor $MN_{17}$. The cascode voltage $V_{cas2}$ is provided to the gates of the second reference transistor $MN_{13}$ and the second output transistor $MN_{15}$. In this way, the current which flows through the first bias transistor $MN_{16}$ affects the cascode voltage $V_{cas2}$.

The bias circuit 704 uses feedback sensed by the first bias transistor $MN_{16}$ to set the cascode voltage $V_{cas2}$. There are two modes of operation for the bias circuit 704 in which the loop gain of the feedback loop is different. When the drain-to-source voltage $V_{DS13}$ of the second reference transistor $MN_{13}$ is less that the voltage threshold $V_t$, the first bias transistor $MN_{16}$ allows less current to flow, limits the feedback and decreases the cascode voltage $V_{cas2}$. Alternatively, when the drain-to-source voltage $V_{DS13}$ of the second reference transistor $MN_{13}$ is more that the voltage threshold $V_t$, the first bias transistor $MN_{16}$ allows more current to flow, increases the feedback and increases the cascode voltage $V_{cas2}$. The cascode voltage $V_{cas2}$ applied to the second reference transistor $MN_{13}$ affects the drain-to-source voltage $V_{DS13}$ of the second reference transistor $MN_{13}$ such that the feedback loop as complete.

Figure 8:
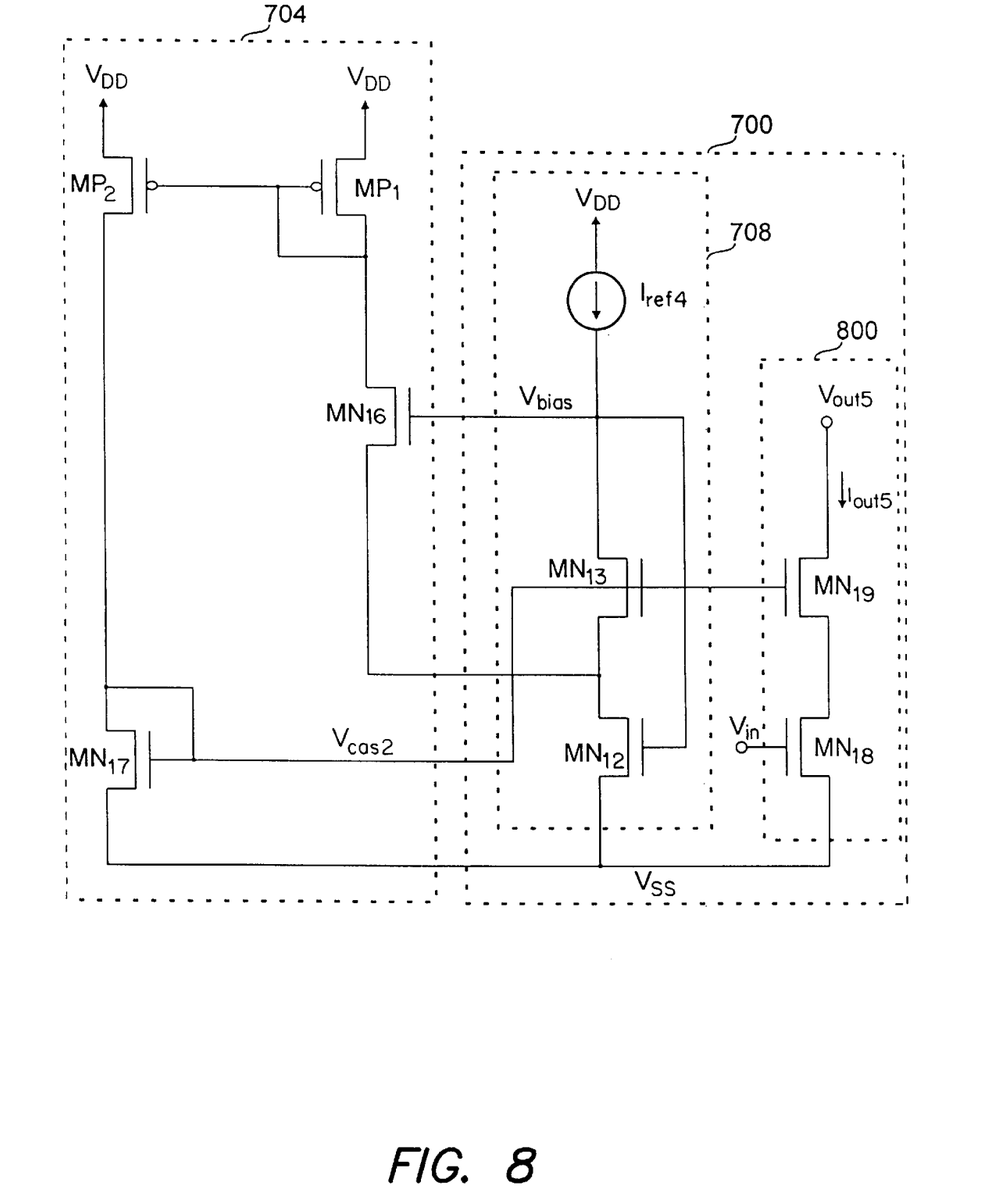
FIG. 8 is a schematic an amplifier circuit which is auto-biased.

As those skilled in the art can appreciate, a current mirror may be configured as a voltage amplifier. With reference to FIG. 8, an embodiment of a voltage amplifier leg 800 which utilizes the present invention is shown. Changes on the input voltage $V_{in}$ are reflected in the output voltage $V_{out5}$ and output current $I_{out5}$ such that the amplifier leg 800 is characterized as having a gain. It should be noted, the same reference 708 and bias circuitry 704 are used to properly bias he amplifier leg 800. The ability to auto-bias this amplifier allows low-swing operation of the amplifier leg 800.

Figure 9:
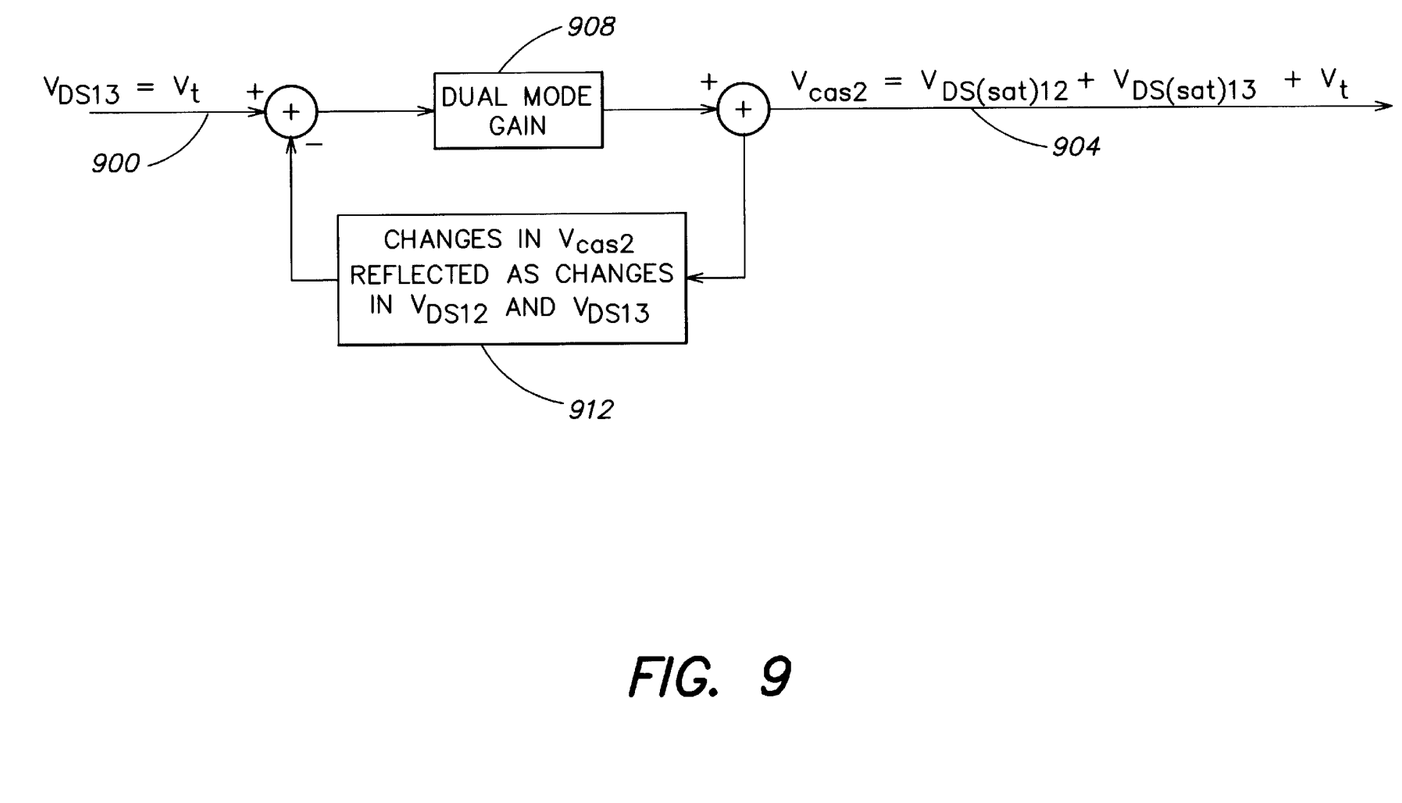
FIG. 9 is a schematic representation of a feedback loop equivalent to the auto-biasing circuit of FIG. 7.

With reference to FIG. 9, the bias circuit 704 is represented as block diagram of a feedback loop. The feedback loop receives the drain-to-source voltage $V_{DS13}$ of the second reference transistor $MN_{13}$ as an input 900 to produce the cascode voltage $V_{cas2}$ as an output 904. A dual mode gain block 908 is applied to the input 904. As explained above, the value of the drain-to-source voltage $V_{DS13}$ of the second reference transistor $MN_{13}$ dictates whether the first bias transistor $MN_{16}$ passes a large current or a small current which is represented as the dual mode gain block 908. A feedback block 912 reflects changes in the cascode voltage $V_{cas2}$ as changes in the drain-to-source voltage $V_{DS13}$ of the second reference transistor $MN_{13}$. As can be appreciated by those skilled in the art, changes in the gate-to-source potential of a transistor will cause changes in the drain-to-source voltage. In this way, the output of the feedback loop 904 settles into supplying the saturation voltage $V_{DS(sat)12}$ of the first reference transistor $MN_{13}$ to the gate of the second reference transistor $MN_{13}$ even if the reference current $I_{ref4}$ changes the saturation voltage $V_{DS(sat)12}$.

Often designers wish to provide excess bias to the drain of the first reference transistor $MN_{12}$. This concept is sometime referred to by those skilled in the art as saturation voltage overdrive $V_{overdrive}$. When a transistor is biased at the "knee" of the saturation region it is said to be at the saturation voltage $V_{DS(sat)}$, however, applying an extra amount of bias to the drain (i.e., applying voltage overdrive $V_{overdrive}$) will insure that the transistor is biased beyond the "knee" and will likely remain in the saturation region. Reference current $I_{ref4}$ changes, semiconductor process variances, operating temperature changes, and other factors can be additionally compensated for by providing for saturation voltage overdrive $V_{overdrive}$.

The bias circuit 704 is capable of providing extra bias $V_{overdrive}$ to the cascode voltage $V_{cas2}$ such that the first reference transistor $MN_{12}$ is more likely to remain in saturation as conditions change. Providing saturation voltage overdrive $V_{overdrive}$ is accomplished by making the fourth bias transistor $MN_{17}$ weak with respect to the first bias transistor $MN_{16}$. Since the current flowing in each leg of the current source of the bias circuit 704 is generally equal because of the current mirror defined by the second and third bias transistors $MP_1$, $MP_2$, the gate voltage $V_{G17}$ of the fourth bias transistor $MN_{17}$ must increase to accommodate the current, if the device is made weaker. By increasing the gate voltage $V_{G17}$, the cascode voltage $V_{cas2}$ also increases which provides saturation voltage overdrive $V_{overdrive}$ to the first reference transistor $MN_{12}$.

Although the above discussion is generally limited to current mirrors configured as current sinks, those skilled in the art can appreciate the principals are equally applicable to current sources as well. Additionally, while the embodiments disclosed use CMOS transistors, the concepts are equally applicable to other transistor types.

The forgoing description of the invention has been presented for the purposes of illustration and description and is not intended to limit the invention. Variations and modifications commensurate with the above description, together with the skill or knowledge of the relevant art, are within the scope of the present invention. The embodiments described herein are further intended to explain the best mode known for practicing the invention and to enable those skilled in the art to utilize the invention in such best mode or other embodiments, with the various modifications that may be required by the particular application or use of the invention. It is intended that the appended claims be construed to include alternative embodiments to the extent permitted by the prior art.

What is claimed is:

1. An auto-biased cascode current circuit, comprising:
   a current mirror having a reference leg and an output leg, wherein a reference current flows within the reference leg and wherein the output leg includes:
      a first output transistor having a first drain-to-source saturation voltage and a threshold voltage;
      a second output transistor, which operates as a cascode transistor, having a second drain-to-source saturation voltage; and
      an output terminal having an output potential; and
   a bias circuit for biasing the reference leg of the current mirror, wherein:
      the output potential is substantially equal to the first drain-to-source saturation voltage plus the second drain-to-source saturation voltage plus a predetermined overdrive voltage,
      the predetermined overdrive voltage is less than the threshold voltage, and
      the bias circuit is responsive to changes in the reference current;
   wherein the reference leg includes:
      a first reference transistor having:
         a first source terminal,
         a first drain terminal, and
         a first gate terminal; and
      a second reference transistor having:
         a second source terminal,
         a second drain terminal, and
         a second gate terminal;
   wherein the bias circuit includes:
      a first bias transistor having:
         a fifth source terminal,
         a fifth drain terminal, and
         a fifth gate terminal;
      a second bias transistor having:
         a sixth source terminal,
         a sixth drain terminal, and
         a sixth gate terminal;
      a third bias transistor having:
         a seventh source terminal,
         a seventh drain terminal, and
         a seventh gate terminal; and
      a fourth bias transistor having:
         a eighth source terminal,
         a eighth drain terminal, and
         a eighth gate terminal
         the fifth gate terminal is connected to the second drain terminal and the first gate terminal,
         the fifth source terminal is connected to the first drain terminal and the second source terminal,
         the eighth gate terminal is connected to the eighth drain terminal and the second gate terminal.

2. The auto-biased cascode current circuit of claim 1, wherein:
   the reference current varies by at least two orders of magnitude.

3. The auto-biased cascade current circuit of claim 1, wherein:

the bias circuit contains at most four transistors.

4. The auto-biased cascode current circuit of claim 1, wherein:
the second source terminal is coupled to the first drain terminal, and
the second drain terminal is coupled to the first gate terminal.

5. The auto-biased cascode current circuit of claim 1, wherein:
the bias circuit generates a cascode potential on the second gate terminal which is a function of a potential difference between at least one of:
the second drain terminal and the second source terminal, and
the second drain terminal and the first gate terminal.

6. The auto-biased cascode current circuit of claim 5, wherein:
the cascode potential affects the potential difference.

7. The auto-biased cascode current circuit of claim 1, wherein:
the first output transistor includes:
a third source terminal,
a third drain terminal, and
a third gate terminal; and
the second output transistor includes:
a fourth source terminal,
a fourth drain terminal, and
a fourth gate terminal.

8. The auto-biased cascode current circuit of claim 7, wherein:
the fourth gate terminal is coupled to the second gate terminal,
the first gate terminal is coupled to the third gate terminal, and
the first source terminal is coupled to the third source terminal.

9. The auto-biased cascode current circuit of claim 1, wherein:
the bias circuit regulates the first drain potential such that the first drain potential is substantially equal to a third drain-to-source saturation voltage of the first reference transistor plus the predetermined overdrive voltage.

10. The auto-biased cascode current circuit of claim 1, wherein:
the bias circuit generates a cascode potential on the second gate terminal which is a function of at least one of:
a second gate potential,
a second drain potential,
a second source potential,
a first drain potential, and
a first gate potential.

11. The auto-biased cascode current circuit of claim 1, further comprising a plurality of output legs each biased by the single bias circuit.

12. The auto-biased cascode current circuit of claim 1, further comprising an input terminal coupled to a gate of the first output transistor.

13. An auto-biased cascode current circuit, comprising:
a first reference transistor which includes:
a first source terminal,
a first drain terminal, and
a first gate terminal;
a second reference transistor which includes:
a second source terminal which is coupled to the first drain terminal,
a second drain terminal which is coupled to the first gate terminal, and
a second gate terminal; and
a reference signal which passes through the first and second reference transistors;
a bias circuit for supplying a cascode signal to the second gate terminal, wherein:
the cascode signal is substantially equal to a drain-to-source saturation voltage of the first reference transistor, and
the cascode signal changes as the reference signal changes,
wherein the bias circuit includes:
a first bias transistor having:
a fifth source terminal,
a fifth drain terminal, and
a fifth gate terminal;
a second bias transistor having:
a sixth source terminal,
a sixth drain terminal, and
a sixth gate terminal;
a third bias transistor having:
a seventh source terminal,
a seventh drain terminal, and
a seventh gate terminal; and
a fourth bias transistor having:
a eighth source terminal,
a eighth drain terminal, and
a eighth gate terminal;
the fifth gate terminal is connected to the second drain terminal and the first gate terminal,
a fifth source terminal is connected to the first drain terminal and the second source terminal,
the eighth gate terminal is connected to the eighth drain terminal and the second gate terminal.

14. The auto-biased cascode current circuit of claim 13, wherein:
the reference current signal by at least two orders of magnitude.

15. The auto-biased cascode current circuit of claim 13, wherein:
the bias circuit contains at most four transistors.

16. The auto-biased cascode current circuit of claim 13, wherein:
the cascode signal is a function of a potential difference between at least one of:
the second drain terminal and the second source terminal, and
the second drain terminal and the first gate terminal.

17. The auto-biased cascode current circuit of claim 16, wherein:
the cascode signal affects the potential difference.

18. The auto-biased cascode current circuit of claim 13, wherein:
the cascode signal is a function of at least one of:
a second gate potential,
a second drain potential,
a second source potential,
a first drain potential, and
a first gate potential.

* * * * *